United States Patent [19]

Kurashina

[11] Patent Number: 5,227,787
[45] Date of Patent: Jul. 13, 1993

[54] DIGITAL DATA CONVERTING SYSTEM
[75] Inventor: Hiroyuki Kurashina, Saitama, Japan
[73] Assignee: Pioneer Electronic Corporation, Tokyo, Japan
[21] Appl. No.: 906,342
[22] Filed: Jun. 30, 1992
[30] Foreign Application Priority Data
   Sep. 2, 1991 [JP] Japan .................... 3-248271
[51] Int. Cl.$^5$ ........................... H03M 7/30
[52] U.S. Cl. ......................... 341/61; 341/123
[58] Field of Search ............ 341/61, 122, 123; 364/724.01; 375/121, 122

[56] References Cited
   U.S. PATENT DOCUMENTS
   4,903,019  2/1990  Ito ........................... 341/61
   4,990,911  2/1991  Fujita et al. .............. 341/123
   5,119,093  6/1992  Vogt et al. ................ 341/123

Primary Examiner—Sharon D. Logan
Attorney, Agent, or Firm—Nikaido, Marmelstein, Murray & Oram

[57] ABSTRACT

A system is provided for converting an input digital data sampled at a first sampling frequency to an output digital data to be sampled at a second sampling frequency. The input digital data is sampled to obtain sampling data with respect to an estimating data corresponding to a data at a sampling point of the output data. The sampling is performed within a period of the least common multiple between a period of sampling of the input digital data and a period of sampling of the output digital data. The estimating data is interpolated from the obtained sampling data.

3 Claims, 3 Drawing Sheets

DIGITAL DATA CONVERTING SYSTEM

BACKGROUND OF THE INVENTION

The present invention relates to a system for converting digital audio or visual data recorded at a sampling frequency to digital data to be sampled at another sampling frequency.

A recordable compact disc (R-CD) is capable of not only reproducing but also recording audio/visual data. The sampling frequency for the R-CD is 44.1 KHz which is the same as the sampling frequency of the CD. On the other hand, a digital-audio tape (DAT) recorder normally uses a 48 KHz sampling frequency, and the broadcast by satellite (BS) system uses 48 KHz or 32 KHz sampling frequency. It is desirable that the digital data recorded on the DAT or transmitted through the BS system can be recorded on the R-CD. In order to perform such a recording, the digital data must be converted into data at the sampling frequency of 44.1 KHz.

Referring to FIG. 3, in a conventional converting system, data which is sampled at a sampling frequency fsin, such as 48 KHz or 32 KHz and quantized is converted into an analog signal by a D/A converter 1. The analog signal is converting to a digital signal by an A/D converter 2 by sampling at a sampling frequency fsout of 44.1 KHz for the R-CD.

However, in the course of the conversion from the digital signal to the analog signal by the D/A converter and vice versa by the A/D converter, the signal-to-noise ratio is aggravated, and furthermore, the signal is distorted. As a result, the output data inevitably becomes erroneous, thereby rendering the quality of the reproduced sound inferior.

In another conventional conversion system shown in FIG. 4, the input data sampled at a frequency fsin is fed to an interpolator 3 having a DSP (dynamic support program) capable of calculation at a high speed, and a multiplier. The data are sampled at a frequency of N·fsin which is the least common multiple between the sampling frequencies fsin and fsout. The output of the interpolator 3 is applied to a decimator 4 where the output is divided by a value of M, which is a quotient of the least common multiple divided by the frequency fout. In other words, the digital data obtained at N·fsin is sampled at the sampling frequency fsout.

However, the value of the multiple N·fsin becomes extremely large, so that the synchronization is difficult. Accordingly, the electronic circuit of the system becomes complicated.

SUMMARY OF THE INVENTION

An object of the present invention is to provide an inexpensive and simple system for converting input digital data sampled at a predetermined sampling frequency to digital data which is different from the input digital data in sampling frequency.

According to the present invention, there is provided a digital data converting system for converting an input digital data sampled at a first sampling frequency to an output digital data to be sampled at second sampling frequency, comprising sampling means for sampling the input digital data to obtain sampling data with respect to an estimating data corresponding to a data at a sampling point of the output data within a period of the least common multiple between a period of sampling of the input digital data and a period of sampling of the output digital data, interpolating means for interpolating the estimating data from the sampling data.

In an aspect of the invention, the sampling means is provided for sampling a value obtained by n-th degree polynomial passing sampling points of input digital data.

In another aspect, sampling means is provided for sampling at a higher sampling frequency than the first sampling frequency.

The other objects and features of this invention will become understood from the following description with reference to the accompanying drawings.

DETAILED DESCRIPTION OF THE PREFERRED EMBODIMENTS

The principle of the present invention is described. The input digital data on the recording medium such as CD are obtained by sampling an audio frequency signal at a first sampling frequency fsin (48 KHz or 32 KHz) and performing the quantization. The digital data converting system according to the present invention converts the input digital data to output digital data having a second sampling frequency fsout (44.1 KHz). In a sampling period, which corresponds to a period of the least common multiple between the period of 1/48 KHz (or 1/32) and the period of 1/44.1 KHz of the frequencies fsin and fsout, the input data is sampled M times which is a quotient of the least common multiple divided by the period of 1/48 KHz. The least common multiples can be expressed as M·fsin=N·fsout. Assuming that the output digital data is sampled N times which is also a quotient of the least common multiple divided by the period of 1/44.1 KHz, the (M+1)th sampling occurs at the same time as the (N+1)th sampling. In the case that the output digital data is sampled by a sampling frequency of k·fsin (k is an arbitrary number), the result comes to the same thing.

Figure 2:
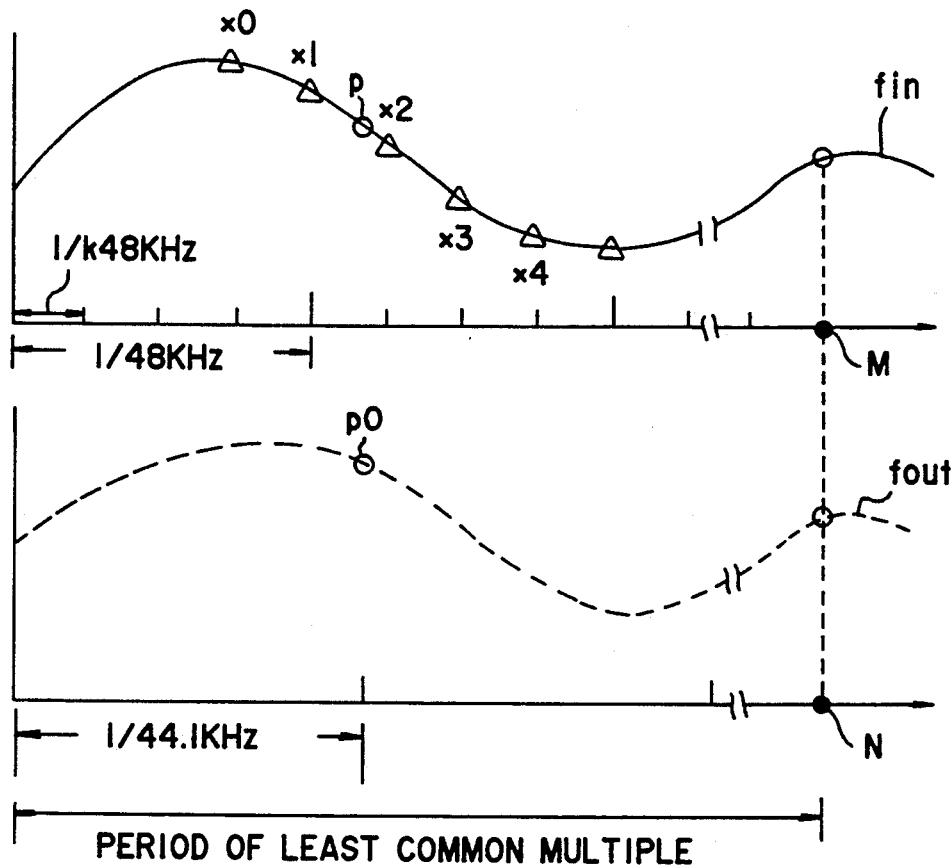
FIG. 2 is a graph explaining the operation of the converting system.
Figure 3:
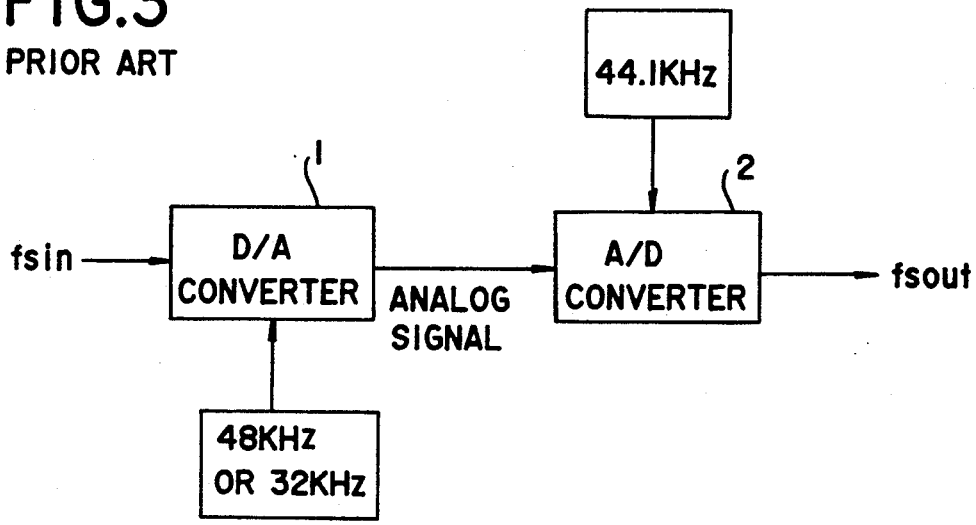
FIGS. 3 and 4 are block diagrams of conventional digital data converting systems.
Figure 4:
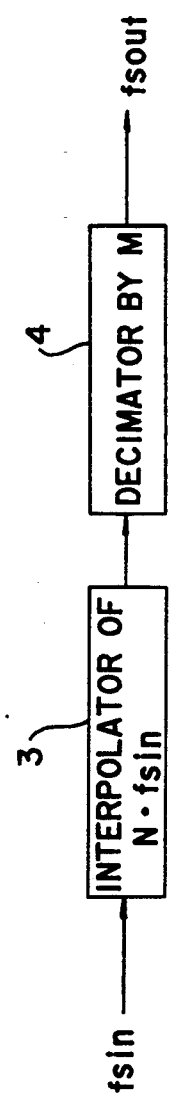

FIG. 2 shows the above described relationship. The line fin connecting points of the input digital data within the period of the least common multiple can be expressed as f(x).

Thus, a point on the line fout can be expressed by a point on the line fin as described hereinafter. Points x of n+1 on the line fin at the sampling point at the sampling frequency of 1/k·48 KHz are obtained by f(x0), f(x1) . . . f(xn). The point $p_0$ on the line fout at the sampling point at the sampling frequency of 1/44.1 KHz is located at the point p on the line fin. The only n-th degree polynomial which satisfies all of the (n+1) number of points is Lagrange's interpolation formula, which is expressed as follows.

$$P(x) = \sum_{k=0}^{n} f(xk) \cdot Lk(x) \quad (1)$$

where Lk(x) is a Lagrange's interpolation coefficient which is further expressed as, $$Lk(x) = \underset{m \neq k}{\overset{n}{\underset{m=0}{\pi}}} (x - xm)/(xk - xm) \quad (2)$$

$$= (x - x0) \cdot (x - x1) \ldots (x - x(k - 1)) \cdot$$
$$(x - x(k + 1)) \ldots (x - xn)/(xk - x0) \cdot$$
$$(xk - x1) \ldots (xk - x(k - 1)) \cdot$$
$$(xk - x(k + 1)) \ldots (xk - xn)$$

If the changing rate between each data is large, that is when the sampling frequency is approximate to one-half of the sampling frequency (fs/2), it is necessary to use a polynominal of high order in order to obtain an accurate data. However, in the system of the present invention, a k-multiple oversampling digital filter is provided so that additional sampling data are interpolated while maintaining the relative sampling timing. Hence the digital data are accurately converted with a polynominal of low order. In the embodiment of the present invention, third order polynominal is used in order to obtain the value at the point p.

Since n=3, the equation (1) is expanded as follows.

$$P(x) = f(x0) [(x - x1) \cdot (x - x2) \cdot (x - x3)/ (x0 - x1) \cdot (x0 - x2) \cdot (x0 - x3)] + \quad (3)$$
$$f(x1) [(x - x0) \cdot (x - x2) \cdot (x - x3)/ (x1 - x0) \cdot (x1 - x2) \cdot (x1 - x3)] +$$
$$f(x2) [(x - x0) \cdot (x - x2) \cdot (x - x3)/ (x2 - x0) \cdot (x2 - x1) \cdot (x2 - x3)] +$$
$$f(x3) [(x - x0) \cdot (x - x2) \cdot (x - x3)/ (x3 - x0) \cdot (x3 - x1) \cdot (x3 - x2)]$$

When the relative positions of the timings x0, x1, x2 and x3 are set equidistantly at −1, 0, +1, and +2, respectively in accordance with Newton's interpolation formula, and each x is within 1 second ($0 \leq x < 1$), the equation (3) is further expanded as follows.

$$P(x) = [(-x^3 + 3x^2 - 2x)/6]f(x0) + \quad (4)$$
$$[(x^3 - 2x^2 - x + 2)/2]f(x1) +$$
$$[(-x^3 + x^2 + 2x)/2]f(x2) +$$
$$[(x^3 - x)/6]f(x3)$$

Since the position of the point p on the line fin can be determined, the value of f(x) for the point p can be obtained from the equation (4).

An embodiment of the present invention is described hereinafter where a digital data sampled at a frequency of 48 KHz is converted to a digital data having a frequency of 44.1 KHz, and a third degree polynominal is used as the Lagrange's interpolation formula.

Figure 1:
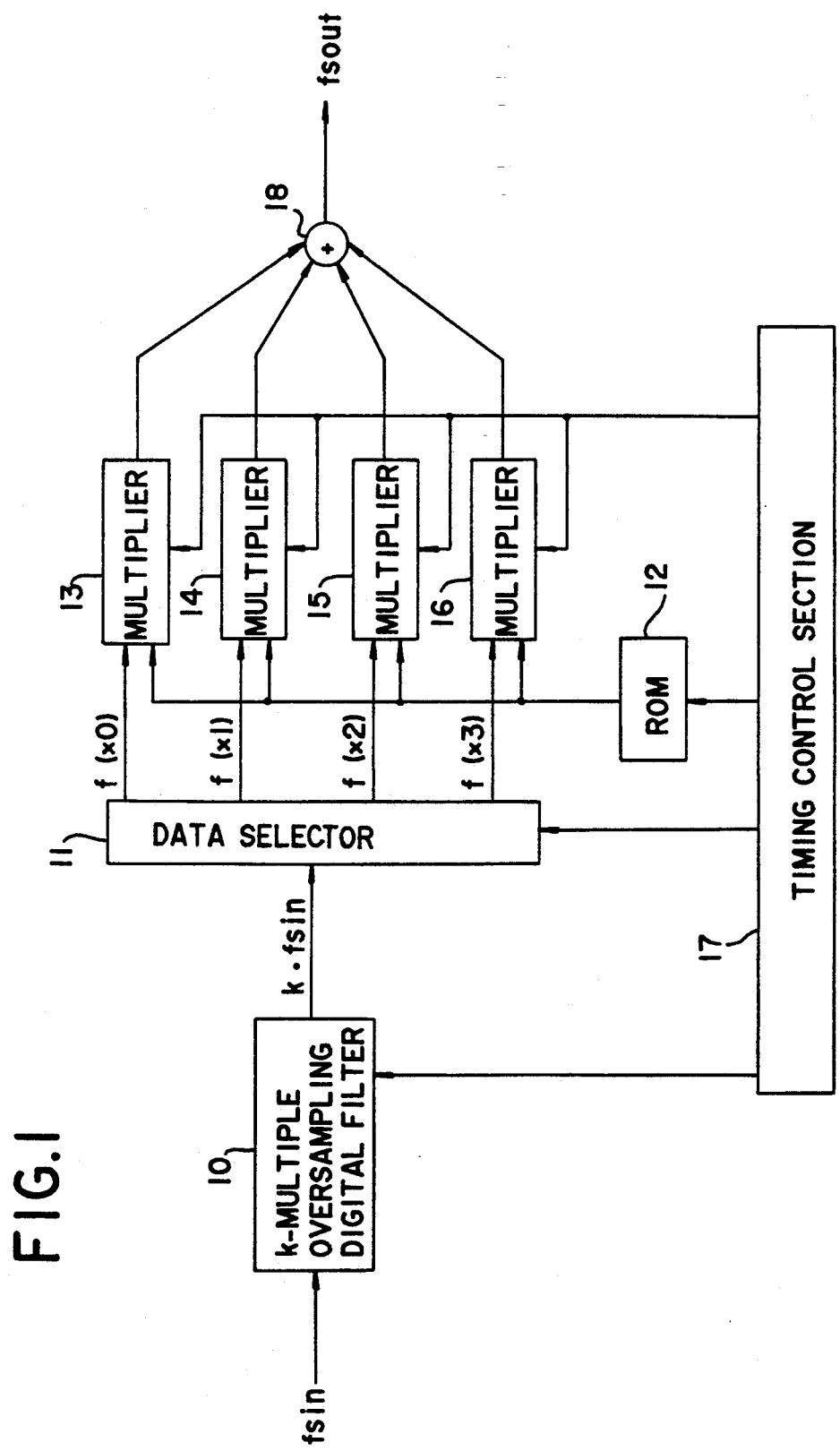
FIG. 1 is a block diagram of a digital data converting system according to the present invention.

Referring to FIG. 1, a digital data converting system according to the present invention has a k-multiple oversampling digital filter 10 (1/k·48 KHz) to which a digital data is fed. The filter 10 operates to sample the input digital data at very small intervals so as to be able to accurately sample digital data.

The sampled data f(x) are applied to a data selector 11 where four data f(x0), f(x1), f(x2), and f(x3) before and after the point p corresponding to the point p₀ are selected. The four data are necessary for calculating the equation (1).

In accordance with the present invention, coefficients $(-x^3+3x^2-2x)/6$, $(x^3-2x^2-x+2)/2$, $(-x^3+x^2+2x)/2$, $(xs-x)/6$ of the four terms in the equation (4) are calculated beforehand and stored in a ROM 12 so that the equation (4) can be easily and quickly calculated.

The selected data f(x0), f(x1), f(x2), and f(x3) from the data selector 11 and the corresponding coefficients are applied to multipliers 13, 14, 15 and 16, respectively, where the terms in the equation (4) are calculated. The terms are added by a full adder 18 so that the data f(x) for the point p is obtained.

The converting system further has a timing control section 17 which applies a timing signal to the oversampling filter 10, data selector 11, ROM 12 and the multipliers 13, 14, 15 and 16 at the frequency fsout (44.1 KHz) in the present embodiment.

The operation of the system is described hereinafter with reference to FIGS. 1 and 2. The input data which is sampled at the frequency of 48 KHz is fed to the k-multiple oversampling filter 10 where data are sampled at the frequency k·48 KHz. The sampled data are applied to the data selector 11 where four data f(x0), f(x1), f(x2), and f(x3) before and after the point p are selected.

The data selector 11 is fed with the timing signal from the timing control section 17, so as to feed each data to the multipliers 13 to 16 in synchronism therewith. The ROM 12 is also fed with the timing signal so that, in response thereto, four coefficients are derived. The coefficients are applied to the corresponding multipliers 13 to 16, thereby calculating the terms with respect to the function data f(x0), f(x1), f(x2), and f(x3). The terms are added by the full adder 18 so that the data f(x) corresponding to the point p is calculated.

The present embodiment may be modified to use a polynominal of a degree higher than 4. With such a system, the digital data can be converted with more accuracy, particularly if the sampled data largely changes between two sampling points.

Although the present invention have been described using Lagrange's interpolation formula, the interpolation may be performed with other methods where a data is estimated based on a plurality of data.

The present embodiment may be further modified to provide only one multiplier which executes a time-shearing multiplexing.

In accordance with the present invention, digital data sampled at one sampling frequency is converted into digital data having another sampling frequency with accuracy and without aggravation in sound-to-noise ratio. Since the system has a simple construction, the manufacturing cost thereof can be decreased.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A digital data converting system for converting an input digital data sampled at a first sampling frequency to an output digital data to be sampled at a second sampling frequency, comprising:
   sampling means for sampling the input digital data at a frequency dependent upon the first sampling frequency to obtain first data at plural points before and after an assumed point corresponding to a sampling point of the output data within a period of the least common multiple between a period of sampling of the input digital data and a period of sampling of the output digital data; and interpolating means coupled to said sampling means, for interpolating the assumed point from the first data, thereby obtaining data for the sampling point.

2. A system according to claim 1, wherein
the sampling means is provided for sampling a value obtained by n-th degree polynominal passing sampling points of input digital data.

3. A system according to claim 2, wherein
the sampling means is provided for sampling at a higher sampling frequency than the first sampling frequency.

* * * * *